United States Patent [19]

Fennel

[11] Patent Number: 4,517,684
[45] Date of Patent: May 14, 1985

[54] METHOD OF AND ARRANGEMENT FOR PROVIDING NUMERICAL VALUES INDICATIVE OF RELATIONSIPS BETWEEN PULSE TRAIN PULSES

[75] Inventor: Helmut Fennel, Frankfurt am Main, Fed. Rep. of Germany

[73] Assignee: ITT Industries, Inc., New York, N.Y.

[21] Appl. No.: 476,646

[22] Filed: Mar. 18, 1983

[30] Foreign Application Priority Data

Apr. 15, 1982 [DE] Fed. Rep. of Germany ....... 3213800

[51] Int. Cl.$^3$ ...................... G04F 10/04; H03K 13/24
[52] U.S. Cl. ........................................ 377/19; 377/39; 328/140
[58] Field of Search ......................... 377/19, 20, 24, 26, 377/39; 307/525, 526, 527, 528; 328/133, 140

[56] References Cited

U.S. PATENT DOCUMENTS 3,621,403 11/1971 Seiy ...................................... 377/39

Primary Examiner—John S. Heyman
Assistant Examiner—K. Ohralik
Attorney, Agent, or Firm—James B. Raden; William J. Michals

[57] ABSTRACT

A method and a device are described by which in pulse trains with variable pulse periods the period and the frequency of the two last-occurring pulses can be determined after each respective pulse in a very short time. To this end, clock pulses with invariable frequency are summed up in a counter whose output is compared to the output signals of a memory in which a table is stored. The table contains period-length values allocated to which are the corresponding frequency values as addresses of the storage locations of the memory. The memory is addressed via a further presettable counter which, in the event of a positive comparative result, will be advanced to a different address in each case. The advancing continues until the occurrence of the next following pulse of the pulse train. After each pulse of the pulse train, the first counter is reset to zero, while the further counter is set to a predetermined address value.

17 Claims, 2 Drawing Figures

| MEMORY LOCATION AND FREQUENCY /Hz | 100 | 101 | 102 | 103 | 104 | 105 | 106 | 107 | 108 | 109 |
|---|---|---|---|---|---|---|---|---|---|---|
| PERIOD /m sec. | 10 | 9,9 | 9,8 | 9,7 | 9,6 | 9,5 | 9,4 | 9,3 | 9,2 | 9,1 |

METHOD OF AND ARRANGEMENT FOR PROVIDING NUMERICAL VALUES INDICATIVE OF RELATIONSIPS BETWEEN PULSE TRAIN PULSES

BACKGROUND OF THE INVENTION

The present invention relates to a method of providing numerical values indicative of the pulse repetition frequency and the pulse-to-pulse period of a pulse train after each pulse of the pulse train which may have varying periods under certain circumstances, and a device for implementing the method.

Rotational velocities can be measured by pulse generators which generate pulse trains whose frequencies are proportional to the rotational velocities. Precise sensing of the speed can be achieved by measuring the time period elapsing between two consecutive pulses. To this end, clock pulses of an oscillator which issues a clock pulse train with constant frequency are being counted. When it is desired to calculate the rotational speeds by using these counted values, reciprocal values will have to be formed.

A method for the determination of velocity is known from the published German application No. 30 08 876, wherein the counting of clock pulses is initiated by the measured pulse of a pulse converter until the number of clock pulses corresponds to a presettable number. The counting action is then continued until the next pulse of a presettable number of measured pulses occurs. The desired velocity value is determined from the ratio of the total number of counted clock pulses to the defined number of measured pulses. According to this method, speed determination can be attained by division only. It is desired in many cases to sense velocities with great accuracy. Numbers with several digits are to be processed under such circumstances. These numbers can be divided in a relatively short time only when complex circuit configurations are being used. With relatively little expenditure in circuit schemes, there ensue long periods of calculation due to the sequential processing of the individual digits.

The period of calculation is frequently limited by the interval between two consecutive pulses issued by a pulse generator that senses the velocity. In the event that the velocity varies within a wide range, differently long periods are available for the calculating operations. Velocities that are variable within wide ranges occur, for instance, when sensing the effects of rotation of vehicle wheels. In vehicles incorporating anti-skid control devices, the rotational speeds are monitored by sensors arranged at the wheels. In a device known from the published British application No. 2,052,901 corresponding to U.S. Pat. No. 4,335,431 issued June 25, 1982 to Junichi Takahashi for preventing the locking of a wheel during braking, a sensor arranged on the drive shaft is connected via pulse-former circuits to input circuits which communicate with the bus of a microprocessor. Further, memories and counters are connected to the bus. The bus comprises a data bus, an address bus and a control bus. In between two consecutive pulses of the sensor, the clock pulses of a clock generator are summed up in counters. The rates of counted values which occurred during several pulse periods are stored in a series of registers from which they are called off by the microprocessor for the speed calculation. With each pulse of the sensor, an interrupt is demanded from the microprocessor. The interrupt releases the speed calculation when the calculation period required is shorter than the pulse period. However, if the pulse period is shorter than a predetermined period that is sufficient to perform the calculation, the interrupt signal will be rendered inoperative by masking until the calculating operation has been completed. Only the following non-masked interrupt signals will result in a new speed calculation. At high rotational speeds of wheels, this method does not use all pulses of the sensor for the speed calculation, so that some important information may be irretrievably lost.

SUMMARY OF THE INVENTION

Accordingly, it is a general object of the present invention to avoid the disadvantages of the prior art.

More particularly, it is an object of the present invention to develop a method of providing numerical values indicative of relationships between consecutive pulses of a pulse train, which method does not possess the disadvantages of the conventional methods of this kind.

It is yet another object of the present invention to devise a method of the above kind which renders it possible to provide the desired numerical values in a very fast manner such that none of the pulses of the pulse train need be disregarded.

A concomitant object of the present invention is to provide an arrangement for implementing the above method.

Still another object of the present invention is so to construct the arrangement of the above type as to be relatively simple in construction, inexpensive to manufacture, and reliable in operation nevertheless.

In pursuance of these objects ahd others which will become apparent hereafter, one feature of the present invention resides in a method of providing numerical values indicative of relationships between consecutive pulse train pulses which may be separated by different time periods, this method comprising the steps of generating a series of clock pulses at intervals of constant length considerably shorter than that of any of the time periods separating the consecutive pulse train pulses; counting the clock pulses commencing with the occurrence of the respective pulse train pulse to obtain an actual value of the time elapsed since such occurrence; retrieving from a first of a plurality of storage locations having consecutive addresses and storing sequential reference values indicative of the elapsed time the reference value stored thereat which is indicative of the shortest elapsed time of interest, using the address of the first storage location; comparing the retrieved reference value with the actual value until their coincidence; advancing on such coincidence to the next consecutive storage location by using a next updated address of such storage location to retrieve the next reference value indicative of the next longer elapsed time therefrom; repeating the comparing step using said next reference value, and the advancing step using the previously updated address, until the occurrence of the next following pulse train pulse; and utilizing the last occurring address prior to the occurrence of such pulse train pulse for forming a numerical value indicative of the instantaneous frequency of the pulse train pulses. Advantageously, the addresses are expressed in terms of frequency values so that the last occurring address is used as the numerical value. It is also advantageous when the method further comprises the step of using the last retrieved reference value prior to the occurrence of the next following pulse train pulse for forming another numerical value indicative of the instantaneous length of the time period separating the pulse train pulses. In this respect, it is currently preferred to express the reference values in terms of period length values, so that they can be directly used as the other numerical values.

This method eliminates the need for extensive calculating efforts to produce the reciprocal value of a counted value. Therefore, the reciprocal values will be available swiftly. Advantageously, this method can be used to determine the frequency of fast running machine parts, for example, the wheels of vehicles of possibly high velocities, or of turbine rotors.

A device for implementing the method described hereinabove according to the present invention includes a resettable counter which is connected to an oscillator delivering a series of clock pulses with invariable frequency. The outputs of the counter are connected to inputs of a comparator which has its further inputs connected to outputs of a memory, wherein period-length values are memorized at storage locations, a respective predetermined address corresponding to the frequency value being allocated to the respective period-length values. The comparator feeds a presettable further counter whose outputs are connected to the address inputs of the memory, and the set and reset inputs of the counters are adapted to be acted upon by the pulse of the pulse train for setting and presetting the counters, respectively.

This arrangement requires little expenditure in circuitry and circuit components. It furthermore renders it possible to obtain values with high resolution even in the case of very short intervals between the pulse train pulses, when pulse generators with high repetition frequency and counters with a high counting speed are used. To achieve this effect, memories affording a correspondingly short access time can be employed.

Preferably, the counter connected to the oscillator and driven in the forward direction is settable by the pulse of the pulse train to the content zero, while the further counter driven in the backward direction is adjustable to the address that corresponds to the highest frequency value. The first counter will thus count in the forward direction, while the further counter counts in the backward direction. This arrangement may be simply and quickly adapted to tables of different magnitudes by merely setting the preset value of the further counter to the desired initial address.

It is arranged for in an expedient construction according to the invention that connected downstream from the memory and the further counter are buffer storage locations, respectively, whose reading-in action is controllable by the respective pulse of the pulse train, and that the setting and resetting inputs of the counters are adapted to be acted upon by the clock pulse with time delay.

The buffer storage holds the values for the pulse frequency and the period available after each pulse time period for further processing. For example, these values can be supplied to a counter which determines the vehicle speed and the slip of the vehicle wheels therefrom by using a further predetermined parameter. After each pulse, the contents of the buffer storage locations will be rewritten by using the respective current pulse frequency values and period-length values. The time delay needs to be only so long as it takes to unproblematically transfer the respective values into the buffer storage locations. There are but short time delays in swift control circuits so that the contents of the storage locations will be available during almost the entire time period between the pulses following the measurement.

Preferably, the pulses of the pulse train will be derived from a sensor which is actuatable upon rotation of an automotive vehicle wheel. Owing to its straightforward design, the arrangement described hereinabove can be manufactured economically. Because of its manufacture being advantageous with respect to costs, the high accuracy attainable and the large speed range capable of being processed, the arrangement is appropriate for use for the determination of speed in automotive vehicles.

In a currently preferred construction, the memory is a read-only memory. This arrangement is particularly reliable in operation.

BRIEF DESCRIPTION OF THE DRAWING

The above-mentioned and other features and objects of the invention will become more apparent by reference to the following description taken in conjunction with the accompanying drawing in which.

DETAILED DESCRIPTION OF THE PREFERRED EMBODIMENTS

Figures 1, 2:
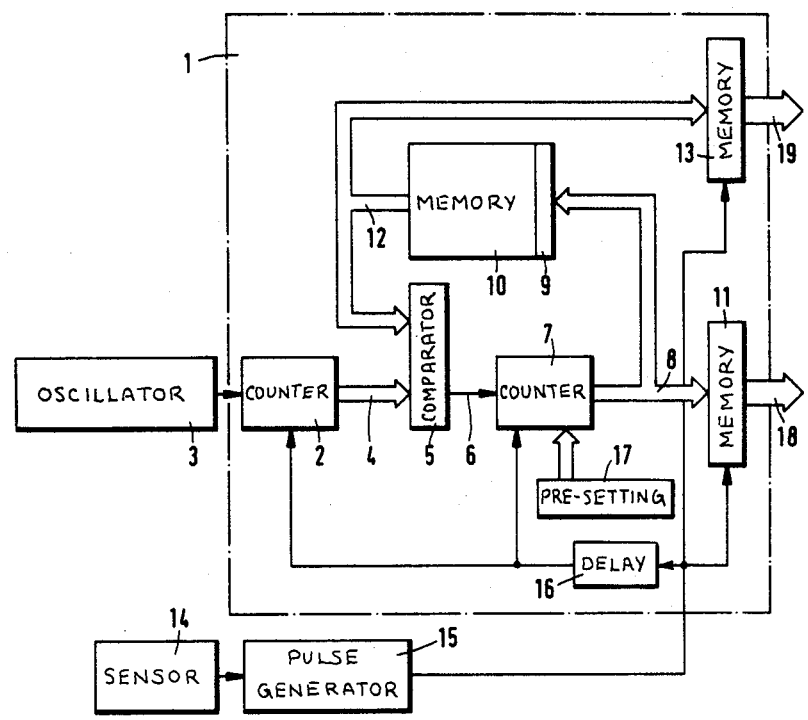
FIG. 1 is a block diagram of an arrangement according to the present invention constructed to provide numerical values which correspond to the pulse frequency and the pulse-to-pulse period of a pulse train, respectively.
FIG. 2 is an example of a table of a part of the contents of the memory in the arrangement shown in FIG. 1.

Referring now to the drawing in detail and first to FIG. 1 thereof, it may be seen that the reference numeral 1 has been used to identify an arrangement of the present invention for providing values corresponding to the pulse frequency and the pulse-to-pulse period of a pulse train, respectively. The arrangement 1 contains a counter 2 driven in the forward counting direction and having its counting input connected to an oscillator 3.

The oscillator 3 may be located within the arrangement 1, or constructed as an external oscillator. FIG. 1 shows an external oscillator 3 which generates clock pulses at a clock rate of constant pulse repetition frequency. The counter 2 has parallel outputs that are connected via lines 4 to inputs of a comparator 5. The comparator 5 issues a signal via a line 6 when the signals present at its inputs to be compared coincide. The line 6 is connected to a counting input of a further counter 7 which is driven in the backward counting direction and which has parallel outputs that are connected via lines 8 to an address circuit 9 of a memory 10, on the one hand, and to inputs of a buffer 11, on the other hand. The memory 10 is a read-only memory which can be programmed. The outputs of the memory 10 are connected via lines 12 to the second inputs of the comparator 5, on the one hand, and to each input of another buffer 13, on the other hand. Each of the buffers 11 and 13 has a plurality of stages of one binary bit each. The number of the stages of the buffers 11 and 13 depends on the number of the lines 8 or 12, respectively. The non-illustrated stages of the memories 11 and 13 are preferably flip-flops whose respective inputs are each connected to one of the lines 8 or 12, respectively, each of them being shown as a parallel line system in FIG. 1.

A sensor 14, which is preferably a pulse generator by means of which the speed of vehicle wheels is monitored, is connected with a pulse former 15 by means of which the pulses of the pulse train are converted such as to generate a respective peak pulse at the occurrence of a rising pulse slope. It is also possible to initiate the peak pulses in response to the declining slopes of the pulses. Suited for use as a pulse former is, for example, a Schmitt-trigger with a monoflop connected downstream. The output of the pulse former 15 is connected to the clock inputs of the buffers 11 and 13 and to a time delay circuit 16, respectively. The output of the time delay circuit 16 feeds the transfer inputs of the counters 2 and 7, respectively. The counter 2 will be reset to the reference value zero in response to the signal issued by the time delay circuit 16. For this reason, the resetting input is being used as the transfer input of the counter 2. The presettable inputs of the counter 7 are coupled to a device 17 by which a reference value is predetermined which is fed into the counter 7 when the transfer input is acted upon.

The memory 10 stores, at its storage locations, a table an example of which is illustrated in FIG. 2 for a simple case of application. There is a fixed allocation of the addresses to the contents of the addressed storage locations. This allocation is chosen such that the addresses correspond to frequency values, while the associated storage cells contain as contents the reciprocal values of these frequency values, i.e. period-length values.

Allocated to the addresses 100, 101, 102, 103, 105, 106, 107, 108 and 109 are, for instance, the same frequency values in hertz etc. The storage locations with the addresses 100 up to 109 will then contain the period-length values 10; 9.9; 9.8; 9.7; 9.6; 9.5; 9.4; 9.3; 9.2; and 9.1 milliseconds. The gradation between the frequency values can be less than that which is shown in FIG. 2. For example, the gradation can amount to one hertz. It is not necessary that the gradation of the frequency values be equal to the gradation of the addresses.

The frequency values, period-length values and addresses are indicated by a decimal code in FIG. 2. These values are contained in the memory 10 preferably in a binary or a hexa-decimal code. Put in this code, the contents of the buffers 11 and 13 which are available in parallel output lines 18 and 19 can be processed more easily by counters, for instance microprocessors, that are connected downstream. The number of digits per storage cell depends upon the desired resolution of the periodic values. In the situation illustrated in FIG. 2, there result only minor differences at frequencies between 100 and 109 hertz so that one digit behind the decimal point will be sufficient with a frequency gradation of 1 hertz.

When the sensor 14 issues a pulse, the pulse former 15 will form a peak pulse in response to which the address present at the output of the counter 7 is transferred into the buffer 11 and the period-length value present at the output of the memory 10 is transferred into the buffer 13. Thus, the buffers 11 and 13 serve as buffer storage locations for the frequency values and the period-length values. After a short time delay caused by the time delay circuit 16, the counter 2 will be set to the contents zero, while the counter 7 is set to the presetting value. The clock pulses generated by the oscillator 3 will be subsequently summed up in the counter 2. The number of the counted clock pulses is constantly compared with the values at the output of the memory 10. The value set in the device 17 corresponds to the highest address value or, for example, to the value 109 according to FIG. 2. Therefore, the period-length value 9.1 millisecond will be available at the output of the memory 10 at the beginning of the counting action. When the contents of the counter 2 has reached this value, the comparator 5 issues a signal to the line 6 indicating the equality or coincidence of the input values. In response to this signal, the contents of the counter 7, which operates as a down-counter, is decreased by one unit. As a result, also the address at the memory 10 will be reduced by one unit, for instance, to 108. Now the period-length value 9.2 will occur at the output of the memory 10 so that the comparator 5 ascertains unequality of the values present at its inputs. The clock pulses of the oscillator 3 continue to increase the contents of the counter 2. In the event of another coincidence of the contents of the counter 2 and the value at the output of the memory 10, the comparator 5 will produce a further control signal to reduce the contents of the counter 7. Thereupon, the counter 7 will decrease the address of the storage location at the memory 10 which is being addressed, thus correspondingly advancing to this next storage location and retrieving the contents thereof, that is, the reference value stored thereat. This sequence of steps will be repeated until the next following pulse is generated by the sensor 14. After having been formed correspondingly by the pulse former 15, this pulse initiates first the transfer of the contents of the counter 7 into the buffer 11 and of the output values of the memory 10 into the buffer 13. Subsequently, the counters 2 or 7 will be reset or preset, respectively. The summing-up of the clock pulses of the counter 2 with the output values of the memory 10 will then begin anew.

The arrangement described hereinabove delivers after each measured pulse of the sensor the values of the frequency and of the period of the preceding pulse interval in a very short time. If the coding is chosen such that the memory addresses correspond to the frequency values, no further calculating action is needed to obtain the frequency. However, a calculation will become necessary if the addresses are coded in the manner shown in FIG. 2. But the coding of the addresses may in all cases be effected such that no division is required when calculating the frequency. This avoids the need for time-consuming calculating operations when determining the frequency.

The frequency of the respective pulse interval serves to determine the circumferential speed of a wheel being monitored by being multiplied by a constant factor which comprises the constant $\pi$, the number 2 and the wheel radius. In the event that the frequency is coded in a binary fashion, only shift operations by corresponding binary digits will be necessary for these multiplications. These shifting operations thus take but a short time.

The above described arrangement with a simple design is suitable for the output of frequency values and period-length values both with longer and with shorter pulse intervals. Great accuracy can be achieved even with shorter pulse intervals by using a high frequency of the clock pulses and a counter 2 capable of operating at high counting rates. It will then, for example, be no longer necessary in high-speed vehicles to leave out of consideration certain individual pulses of the sensor 14 when determining the frequency.

While I have described above the principles of my invention in connection with a specific arrangement, it is to be clearly understood that this description is made only by way of example and not as a limitation to the scope of my invention as set forth in the objects thereof and in the accompanying claims.

I claim:

1. A method of providing numerical values indicative of relationships between consecutive pulse train pulses which may be separated by different time periods, comprising the steps of:

generating a series of clock pulses at intervals of constant length considerably shorter than that of any of the time periods separating the consecutive pulse train pulses;

counting said clock pulses commencing with the occurrence of the respective pulse train pulse to obtain an actual value of the time elapsed since such occurrence;

retrieving from a first of a plurality of storage locations having consecutive addresses and storing sequential reference values indicative of the elapsed time the reference value stored thereat which is indicative of the shortest elapsed time of interest, using the address of the first storage location;

comparing said retrieved reference value with said actual value until their coincidence;

advancing on such coincidence to the next consecutive storage location by using a next updated address of such storage location to retrieve the next reference value indicative of the next longer elapsed time therefrom;

repeating said comparing step using said next reference value, and said advancing step using the previously updated address, until the occurrence of the next following pulse train pulse; and utilizing the last occurring address prior to the occurrence of such pulse train pulse for forming a numerical value indicative of the instantaneous frequency of the pulse train pulses.

2. The method as defined in claim 1, wherein said addresses are expressed in terms of frequency values; and wherein said utilizing step includes using the last occurring address as said numerical value.

3. The method as defined in claim 1, and further comprising the step of using the last retrieved reference value prior to the occurrence of said next following pulse train pulse for forming another numerical value indicative of the instantaneous length of the time period separating the pulse train pulses.

4. The method as defined in claim 3, wherein said reference values are expressed in terms of period lengths; and wherein said using step includes employing said reference values as said other numerical values.

5. The method as defined in claim 3, wherein said addresses are expressed in terms of frequency values and said reference values are in such an inverse proportion to the respective addresses as to be expressed in terms of period lengths; wherein said utilizing step includes employing said addresses as said numerical values; and wherein said using step includes employing said reference values as said other numerical values.

6. The method as defined in claim 1, and further comprising the step of presetting the address of said first storage location to be used in said retrieving step.

7. The method as defined in claim 1, and further comprising the step of restarting the steps following said generating step on occurrence of each of the pulse train pulses.

8. An arrangement for providing numerical values indicative of relationships between consecutive pulse train pulses which may be separated by different time periods, comprising:

means for generating a series of clock pulses at intervals of constant length considerably shorter than that of any of the time periods separating the consecutive pulse train pulses;

means for counting said clock pulses commencing with the occurrence of the respective pulse train pulse to obtain an actual value of the time elapsed since such occurrence;

a plurality of storage locations having consecutive addresses and storing sequential reference values indicative of the elapsed time;

means for retrieving said reference values from said storage locations, including means for consecutively addressing such storage locations starting with a first of said storage locations that contains the reference value indicative of the shortest elapsed time of interest;

means for comparing the retrieved reference value with said actual value;

means for advancing the addressing of said storage locations on coincidence of said retrieved reference value with said actual value up to the occurrence of the next following pulse train pulse to an updated address of the next consecutive storage location to retrieve the reference value stored thereat which is indicative of the next longer elapsed time for use by said comparing means; and means for utilizing the last occurring address prior to the occurrence of such next following pulse train pulse for forming a numerical value indicative of the instantaneous frequency of the pulse train pulses.

9. The arrangement as defined in claim 8; and further comprising means for using the last retrieved reference value prior to the occurrence of said next following pulse train pulse for forming another numerical value indicative of the instantaneous length of the time period separating said pulse train pulses.

10. The arrangement as defined in claim 9, wherein said reference values stored at the respective storage locations are in an inverse proportion to the respective addresses of such locations such that said reference values are expressed in terms of period lengths and the associated addresses are expressed in terms of corresponding frequency values.

11. The arrangement as defined in claim 10, wherein said generating means includes an oscillator; wherein said counting means includes an up-counter; wherein said comparing means includes a comparator which issues a control signal on the occurrence of said coincidence; and wherein said advancing means includes a down-counter responsive to said control signal to reduce its count which constitutes the address for use in addressing the respective storage location.

12. The arrangement as defined in claim 11; and further comprising means for setting said up-counter to the count zero upon occurrence of each of said pulse train pulses; and means for resetting said down-counter to the highest count upon the occurrence of each of said pulse train pulses.

13. The arrangement as defined in claim 10, wherein said utilizing and using means includes respective buffer storage locations respectively connected to the outputs of said advancing means and of said storage locations.

14. The arrangement as defined in claim 13, wherein said buffer storage locations are enabled for receiving said last occurring address and said last occurring reference value, respectively, by said next following pulse train pulse.

15. The arrangement as defined in claim 14, and further comprising means for returning said counting and advancing means to their respective initial states upon activation; and means for introducing a predetermined time delay between the occurrence of said next following pulse train pulse and the activation of said returning means.

16. The arrangement as defined in claim 8, wherein said storage locations are constituent parts of a read-only memory.

17. The arrangement as defined in claim 8 for use in detecting the speed of rotation of a vehicle wheel; and further comprising means for sensing the speed of rotation of the wheel and for generating said pulse train pulses in response to such sensing.

* * * * *